(12) United States Patent
Kawada et al.

(10) Patent No.: US 8,802,546 B2
(45) Date of Patent: Aug. 12, 2014

(54) METHOD FOR MANUFACTURING SILICON CARBIDE SEMICONDUCTOR DEVICE

(71) Applicant: Fuji Electric Co., Ltd., Kawasaki (JP)

(72) Inventors: Yasuyuki Kawada, Matsumoto (JP); Yoshiyuki Yonezawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/943,055

(22) Filed: Jul. 16, 2013

(65) Prior Publication Data

US 2014/0065800 A1 Mar. 6, 2014

(30) Foreign Application Priority Data

Aug. 30, 2012 (JP) ................. 2012-190096

(51) Int. Cl.
*H01L 21/20* (2006.01)
(52) U.S. Cl.
USPC .............. 438/478; 438/507; 257/E21.065
(58) Field of Classification Search
CPC ............ H01L 21/02441; H01L 21/02518
USPC .................................. 257/E21.065
See application file for complete search history.

(56) References Cited

U.S. PATENT DOCUMENTS

| | | | |
|---|---|---|---|
| 2007/0062441 A1 | 3/2007 | Koshka | |
| 2009/0242899 A1 | 10/2009 | Zhang | |
| 2011/0278596 A1 | 11/2011 | Aigo et al. | |

FOREIGN PATENT DOCUMENTS

| | | |
|---|---|---|
| JP | 2006-321696 A | 11/2006 |
| JP | 2009-508799 A | 3/2009 |
| JP | 4719314 B | 4/2011 |
| JP | 2011-515325 A | 5/2011 |

OTHER PUBLICATIONS

Powell, et al., "Surface Morphology of Silicon Carbide Epitaxial Films"; Journal of Electronic Materials, vol. 24, No. 4, Jan. 1, 1995; pp. 295-301.
Melnychuk, et al., "Effect of HCl addition on gas-phase and surface reactions during homoepitaxial growth of SiC at low temperatures", Journal of Applied Physics, vol. 104, No. 5, Sep. 10, 2008, pp. 53517-1-53517-10.
Pedersen, et al., "Donor incorporation in SiC epilayers grown at high growth rate with chloride-based CVD", Journal of Crystal Growth, vol. 311, No. 5, Feb. 15, 2009, pp. 1321-1327.
Extended European Search Report for corresponding EP 13176458.1, mail dated Apr. 25, 2014.

*Primary Examiner* — Cheung Lee
(74) *Attorney, Agent, or Firm* — Rossi, Kimms & McDowell, LLP (57) ABSTRACT

Gas containing Si, gas containing C and gas containing Cl are introduced into a reacting furnace. SiC epitaxial film is grown on the surface of a 4H—SiC substrate by CVD in a gas atmosphere including raw material gas, additive gas, doping gas and carrier gas. The amount of the gas containing Cl relative to the gas containing Si in the gas atmosphere is reduced gradually. At the start of growth, the number of Cl atoms in the gas containing Cl is three times as large as the number of Si atoms in the gas containing Si. The number of Cl atoms in the gas containing Cl relative to the number of Si atoms in the gas containing Si in the gas atmosphere is reduced at a rate of 0.5%/min to 1.0%/min. The method grows silicon carbide semiconductor film at a high rate.

7 Claims, 6 Drawing Sheets

METHOD FOR MANUFACTURING SILICON CARBIDE SEMICONDUCTOR DEVICE

BACKGROUND OF THE INVENTION

A. Field of the Invention

The present invention relates to a method for manufacturing a silicon carbide semiconductor device.

B. Description of the Related Art

Compound semiconductors using four-layered hexagonal silicon carbide (4H—SiC) as a semiconductor material are known. When a power semiconductor device is manufactured using 4H—SiC as a semiconductor material, a 4H—SiC single-crystal film (hereinafter referred to as "SiC epitaxial film") is epitaxially grown on a semiconductor substrate made of 4H—SiC (hereinafter referred to as "4H—SiC substrate") so as to manufacture a SiC single-crystal substrate. ACVD (Chemical Vapor Deposition) method has been used as an epitaxial growth method.

In the epitaxial growth using the CVD method, raw material gas flowing into a reaction vessel (chamber) is thermally decomposed in carrier gas, and silicon (Si) atoms are then deposited continuously on the crystal lattice of a 4H—SiC substrate so as to grow a SiC epitaxial film on the 4H—SiC substrate. Generally, monosilane ($SiH_4$) gas and dimethylmethane ($C_3H_8$) gas are used as the raw material gas and hydrogen ($H_2$) gas is used as the carrier gas. In addition, nitrogen ($N_2$) gas or trimethylaluminum (TMA) gas is suitably added as doping gas.

A method for epitaxially growing a SiC epitaxial film on a 4H—SiC substrate has been proposed in which, in the process of epitaxially growing a silicon carbide single-crystal thin-film by a thermochemical deposition method on a silicon carbide single-crystal substrate whose off angle is not larger than 4°, hydrogen chloride gas is introduced at the same time that raw material gas containing carbon and silicon is introduced. The atomic ratio (C/Si ratio) of carbon to silicon contained in the raw material gas is not higher than 1.5 and the atomic ratio (Cl/Si ratio) of chlorine in the hydrogen chloride gas to silicon in the raw material gas is higher than 1.0 and lower than 20.0 (for example, see Japanese Patent No. 4719314).

As another method, there has been proposed a method which is a method for manufacturing a silicon carbide single crystal using a CVD method, in which hydrogenated gas of silicon and hydrocarbon gas are supplied onto a heated SiC substrate together with carrier gas so as to grow the single crystal due to thermal decomposition reaction. In the manufacturing method, a SiC single-crystal substrate inclined at a small inclination angle from a (0001) plane thereof is used as the SiC substrate, and HCl gas is supplied onto the SiC single-crystal substrate simultaneously with the hydrogenated gas of silicon, the hydrocarbon gas and the carrier gas (for example, see JP-A-2006-321696).

However, in prior epitaxial growth methods the growth rate is low to be about several μm/h. To grow an epitaxial film with a thickness (film thickness) of several tens or more μm required for manufacturing a high-voltage device, there arises such a big problem on industrial production that it takes considerable time to grow the SiC epitaxial film. For example, to manufacture a high-voltage SiC semiconductor device with a breakdown voltage of 10 kV or higher, it is necessary to grow a 4H—SiC single-crystal film at least about 100 μm thick on a 4H—SiC substrate. Therefore, the increase of the epitaxial growth rate on industrial production is required.

The present invention is directed to overcoming or at least reducing the effects of one or more of the problems set forth above.

SUMMARY OF THE INVENTION

In order to solve the foregoing problems the invention provides a method for manufacturing a silicon carbide semiconductor device, by which a silicon carbide semiconductor film can be grown at a high rate.

The present inventors have found, as a result of diligent research, that the growth rate of a SiC epitaxial film can be increased dramatically (10 or more times as high as in the prior art) when the SiC epitaxial film is grown with gas containing chlorine (Cl) introduced simultaneously with raw material gas. In addition, the inventors have found that when the flow rate of the gas containing chlorine is reduced gradually with the passage of the time in which the SiC epitaxial film is grown (hereinafter referred to as "film formation time"), the decrease of the growth rate of the SiC epitaxial film with the passage of the film formation time can be suppressed. The invention has been accomplished based on this discovery.

In order to solve the foregoing problems, a method for manufacturing a silicon carbide semiconductor device according to the invention has the following steps. A first step of exposing a silicon carbide semiconductor substrate to a gas atmosphere in which gas containing chlorine is added to gas containing silicon and gas containing carbon is performed, so as to grow a silicon carbide semiconductor film on the silicon carbide semiconductor substrate. In addition, a second step of gradually reducing the introduction amount of the gas containing chlorine relative to the gas containing silicon in the gas atmosphere during the growth of the silicon carbide semiconductor film is performed.

In addition, according to the invention, a method is provided for manufacturing a silicon carbide semiconductor device in the aforementioned configuration, wherein the number of chlorine atoms in the gas containing chlorine relative to the number of silicon atoms in the gas containing silicon in the gas atmosphere is reduced at a rate of 0.5%/minute to 1.0%/minute in the second step.

In addition, according to the invention, a method is provided for manufacturing a silicon carbide semiconductor device in the aforementioned configuration, wherein the second step is performed at the time of start of the first step.

In addition, according to the invention, a method is provided for manufacturing a silicon carbide semiconductor device in the aforementioned configuration, wherein the number of chlorine atoms in the gas containing chlorine is three times as large as the number of silicon atoms in the gas containing silicon in the composition of the gas atmosphere at the time of start of the first step.

In addition, according to the invention, a method is provided for manufacturing a silicon carbide semiconductor device in the aforementioned configuration, wherein: the gas containing chlorine is hydrogen chloride gas or chlorine gas.

In addition, according to the invention, a method is provided for manufacturing a silicon carbide semiconductor device in the aforementioned configuration, wherein the silicon carbide semiconductor film made of a single crystal is grown by a chemical vapor deposition method in the first step.

According to the aforementioned configuration, a gas atmosphere is formed in such a manner that a suitable amount of gas containing chlorine is added to raw material gas including gas containing silicon and gas containing carbon so that the introduction amount of the raw material gas contributing to the growth of the silicon carbide semiconductor film can be increased. In addition, according to the aforementioned configuration, the number of chlorine atoms in the gas containing chlorine is reduced gradually with the passage of the film formation time of the silicon carbide semiconductor film so that the number of unreacted chlorine atoms increasing in the gas atmosphere can be reduced with the passage of the film formation time of the silicon carbide semiconductor film. Therefore, the situation that the silicon carbide semiconductor film that is growing is etched by the unreacted chlorine atoms can be suppressed. Thus, the lowering of the growth rate of the silicon carbide semiconductor film can be suppressed.

According to the method for manufacturing a silicon carbide semiconductor device according to the invention, an effect that a silicon carbide semiconductor film can be grown at a high rate is obtained.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

A preferred embodiment of a method for manufacturing a silicon carbide semiconductor device according to the invention will be described below in detail with reference to the accompanying drawings. Like constituents are referred to by like numerals correspondingly in the following description of an embodiment and the accompanying drawings, and duplicate description thereof will be omitted.

Embodiment

Figure 1A:
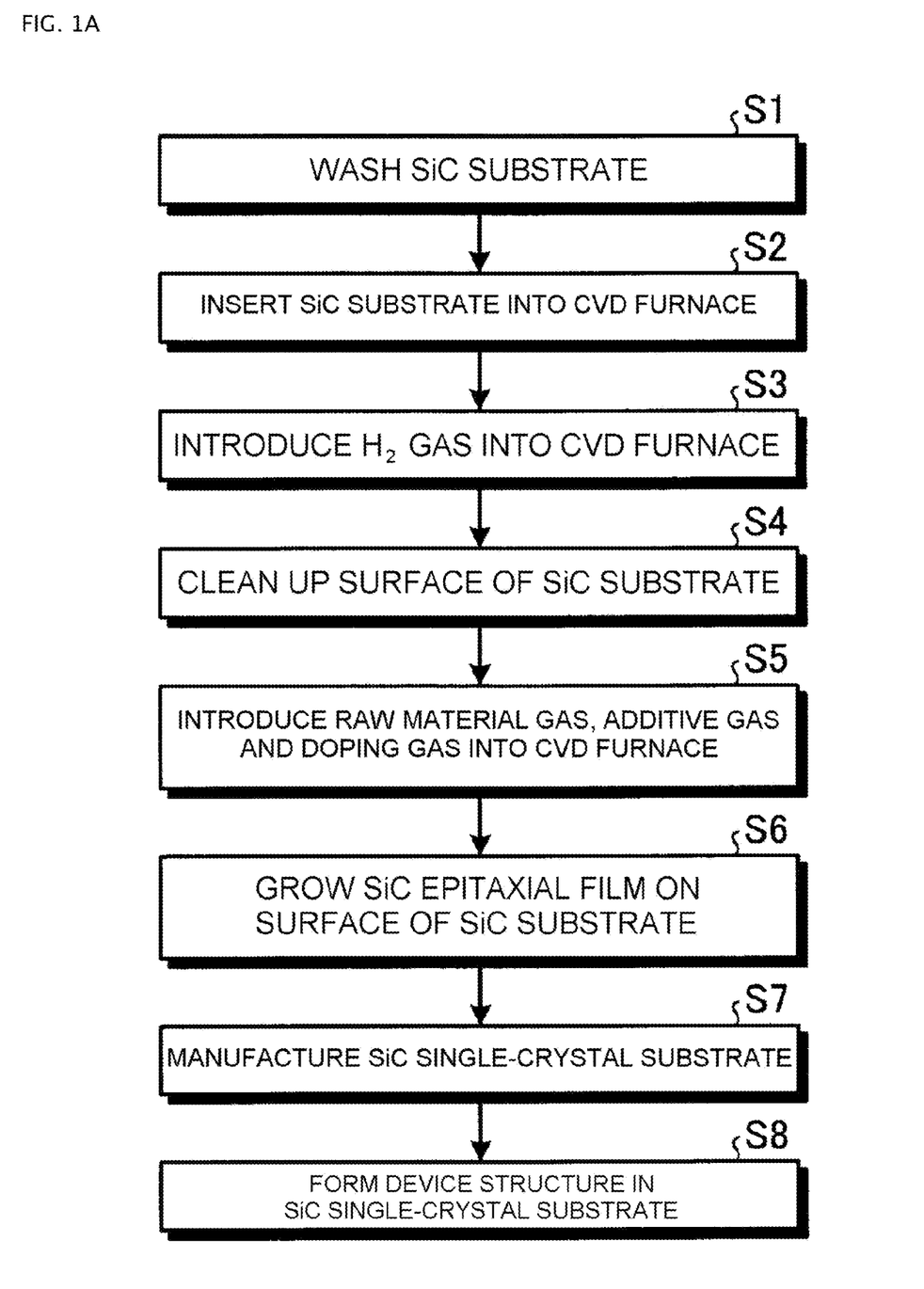
FIG. 1A is a flow chart showing the outline of a method for manufacturing a silicon carbide semiconductor device according to an embodiment.
Figure 1B:
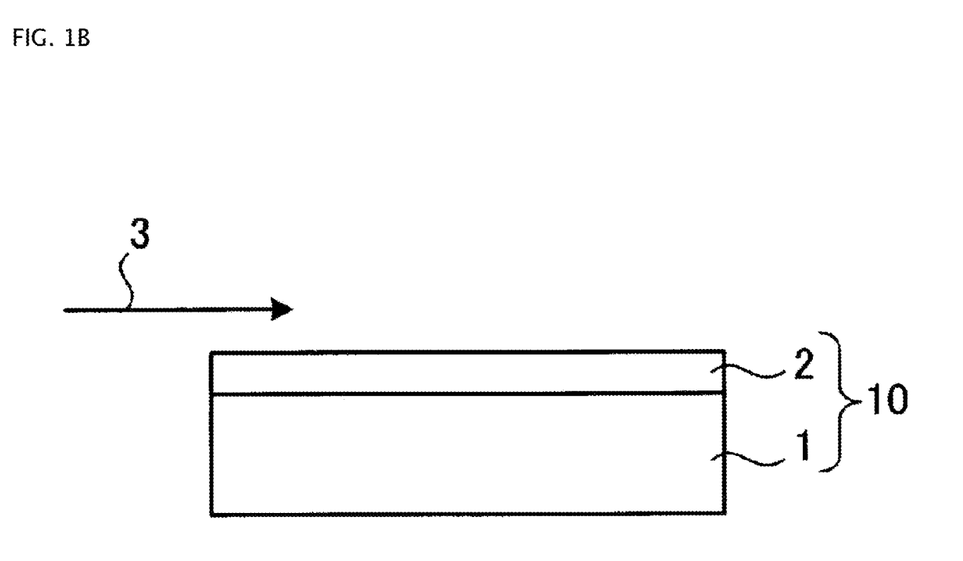
FIG. 1B is a sectional view showing a state in which the silicon carbide semiconductor device is being manufactured according to the embodiment.

A method for manufacturing a silicon carbide semiconductor device according to an embodiment will be described in the case where a semiconductor device is produced (manufactured) using four-layered hexagonal silicon carbide (4H—SiC) as a semiconductor material, by way of example. FIG. 1A is a flow chart showing the outline of the method for manufacturing the silicon carbide semiconductor device according to the embodiment. FIG. 1B is a sectional view showing a state in which the silicon carbide semiconductor device is being manufactured according to the embodiment. First, a substrate (4H—SiC substrate) 1 made of 4H—SiC is prepared, and washed by a general organic cleaning method or a general RCA cleaning method (Step S1).

Next, 4H—SiC substrate 1 is inserted into a reacting furnace (chamber, not shown) in order to grow 4H—SiC single-crystal film (hereinafter referred to as "SiC epitaxial film (silicon carbide semiconductor film)") 2 by a chemical vapor deposition (CVD) method (Step S2). The reacting furnace is evacuated, for example, to a vacuum degree of $1\times10^{-3}$ Pa or lower. Hydrogen ($H_2$) gas purified by a general purifier is introduced into the reacting furnace at a flow rate of 20 L/min for 10 minutes so as to replace the vacuum atmosphere in the reacting furnace with a $H_2$ atmosphere (Step S3).

The surface of 4H—SiC substrate 1 is cleaned up by chemical etching with $H_2$ gas (Step S4). Specifically, the surface of 4H—SiC substrate 1 is cleaned up in Step 4 as follows. First, while the $H_2$ gas is introduced at 20 L/min, the inside of the reacting furnace is heated, for example, by high-frequency induction. Then, after the temperature in the reacting furnace has risen to, for example, 1,600° C., the temperature is maintained for about 10 minutes. In this manner, the surface of 4H—SiC substrate 1 is cleaned. The temperature in the reacting furnace is measured, for example, by a radiation thermometer, and controlled.

The temperature in the reacting furnace is adjusted to set the temperature of 4H—SiC substrate 1 at a predetermined temperature (hereinafter referred to as "film formation temperature") for growing SiC epitaxial film 2. Next, in the state where the $H_2$ gas introduced in Step S3 has been introduced as carrier gas, raw material gas, gas to be added to the raw material gas (hereinafter referred to as "additive gas"), and doping gas are further introduced into the reacting furnace (Step S5). In FIG. 1B, the flows of the raw material gas, the additive gas, the doping gas and the carrier gas are designated collectively by an arrow 3.

In the gas atmosphere including the raw material gas, the additive gas, the doping gas and the carrier gas introduced in Step S5, the SiC epitaxial film 2 is grown on the surface of 4H—SiC substrate 1 by a chemical vapor deposition (CVD) method (Step S6: first step). On this occasion, the introduction amount of gas containing Cl relative to gas containing Si in the gas atmosphere is reduced gradually (second step). It is preferable that the second step is carried out at the time of start of the first step. The kinds and introduction conditions of the raw material gas, the additive gas and the doping gas for growing SiC epitaxial film 2 in Step S6 are as follows.

Gas containing silicon (Si) and gas containing carbon (C) are used as the raw material gas. The gas containing Si may be, for example, gas of monosilane diluted with $H_2$ 50% (hereinafter referred to as "$SiH_4/H_2$"). The gas containing C may be, for example, gas of dimethylmethane diluted with $H_2$ 20% (hereinafter referred to as "$C_3H_8/H_2$"). Nitrogen ($N_2$) gas or trimethylaluminum (TMA) gas may be, for example, used as the doping gas. The addition of the doping gas is optional.

Gas containing chlorine (Cl) is used as the additive gas. That is, SiC epitaxial film 2 is grown by a halide CVD method using halide. When the gas containing Cl is added to the raw material gas, a large amount of the raw material gas can be introduced to achieve epitaxial growth at a high rate, as compared with that in the case where the gas containing Cl is not added. The gas containing Cl may be, for example, hydrogen chloride (HCl) gas or $Cl_2$ gas.

Preferably, the ratio of the number of Cl atoms in the gas containing Cl to the number of Si atoms in the gas containing Si at the time of start of the growth (film formation) of SiC epitaxial film 2, that is, at the time of start of the first step (hereinafter referred to as "initial Cl/Si ratio") is, for example, 3.0 (the number of Cl atoms=3× the number of Si atoms). The gas atmosphere composition in the reacting furnace can be optimized to make the growth rate of SiC epitaxial film 2 highest in proportion to the flow rate of the raw material gas.

Only the introduction amount of the gas containing Cl is reduced gradually during the growth of SiC epitaxial film 2, so as to gradually reduce the number of chlorine atoms in the gas atmosphere with the passage of the time of growing SiC epitaxial film 2 (film formation time). That is, the ratio (Cl/Si ratio) of the number of Cl atoms in the gas containing Cl to the number of Si atoms in the gas containing Si is reduced gradually during the growth of SiC epitaxial film 2. Specifically, it is preferable that the introduction amount of the gas containing Cl into the reacting furnace is reduced to reduce the Cl/Si ratio at a rate of 0.5%/min to 1.0%/min since the time of start of growth of the SiC epitaxial film 2 (0 minute). It is because of this that the decrease in the growth rate of SiC epitaxial film 2 can be suppressed.

After this, SiC epitaxial film 2 is grown to a predetermined thickness (for example, about 100 μm) under the aforementioned gas atmosphere composition conditions, so as to manufacture SiC single-crystal substrate 10 in which SiC epitaxial film 2 is laminated on 4H—SiC substrate 1 (Step S7). A predetermined device structure (not shown) is formed in SiC single-crystal substrate 10 (Step S8). Thus, a SiC semiconductor device is completed.

Figure 2:
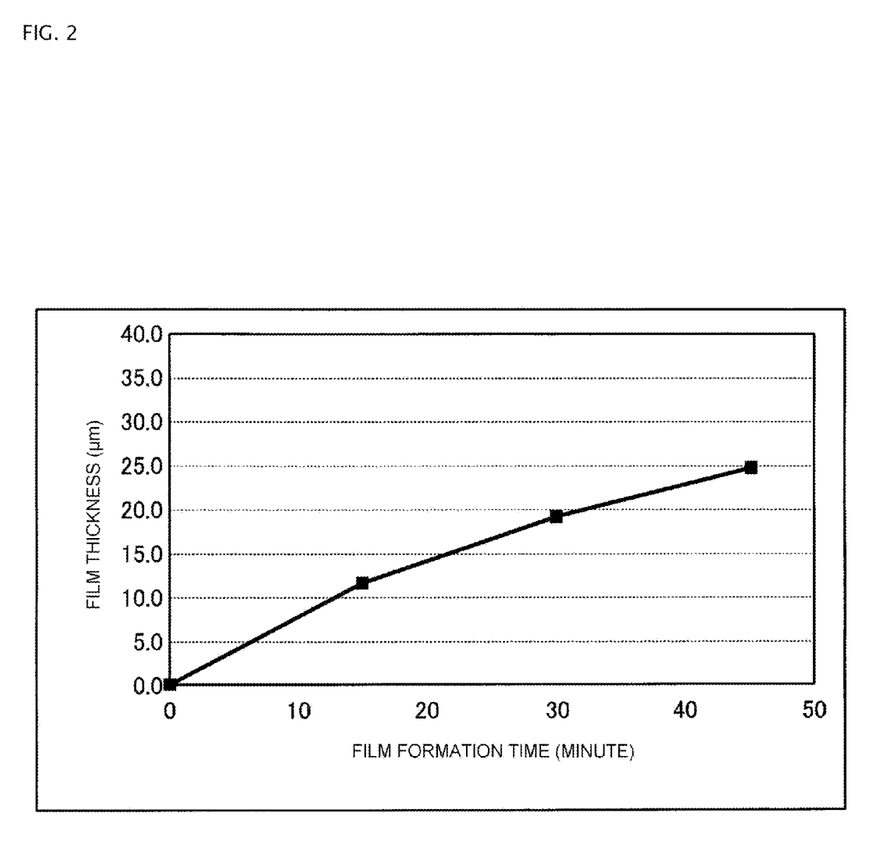
FIG. 2 is a characteristic graph showing the relation between the film formation time and the film thickness of a SiC epitaxial film in a first comparative example.

About Increment of Film Thickness of SiC Epitaxial Film in First Comparative Example Next, description will be made on the relation between the film formation time and the film thickness of a SiC epitaxial film. FIG. 2 is a characteristic graph showing the relation between the film formation time and the film thickness of a SiC epitaxial film in a first comparative example. The relation was verified between the film formation time and the film thickness of a SiC epitaxial film when gas containing Cl was used as the additive gas (hereinafter referred to as "first comparative example"). Film formation conditions in the first comparative example were as follows. First, the gas atmosphere in the reacting furnace was set as a gas atmosphere in which HCl gas as additive gas was added to $SiH_4/H_2$ gas and $C_3H_8/H_2$ gas as raw material gas.

Then, the introduction amount of the raw material gas was adjusted so that the ratio (C/Si ratio) of the number of C atoms to the number of Si atoms in the gas atmosphere was kept at 1.0. In addition, the introduction amount of the additive gas was adjusted so that the ratio (Cl/Si ratio) of the number of Cl atoms to the number of Si atoms in the gas atmosphere was kept at 3.0. Specifically, the introduction amounts of the $SiH_4/H_2$ gas, the $C_3H_8/H_2$ gas and the HCl gas were set at 200 sccm, 166 sccm and 300 sccm respectively. No doping gas was used.

Then, a SiC epitaxial film was grown on the surface of the 4H—SiC substrate by a general CVD method. The film thickness of the SiC epitaxial film was measured after a lapse of 15 minutes, after a lapse of 30 minutes and after a lapse of 45 minutes since the start of growth (0 minute). The film formation temperature of the SiC epitaxial film in the reacting furnace was set at 1,700° C. From the result shown in FIG. 2, it was proved that the increment of the film thickness of the SiC epitaxial film between the film thickness measuring points (between 0 minute and 15 minutes, between 15 minutes and 30 minutes, and between 30 minutes and 45 minutes) was reduced with the passage of the film formation time.

About Gas Atmosphere Composition in Reacting Furnace During Growth of SiC Epitaxial Film A proportional relation is generally established between the film formation time and the film thickness of an epitaxial film. It was, however, proved that, when gas containing Cl was added to raw material gas, a proportional relation was not established between the film formation time and the film thickness of a SiC epitaxial film. Specifically, when gas containing Cl was added to raw material gas, the increment of the film thickness of the SiC epitaxial film was reduced with the passage of the film formation time. Therefore, the gas atmosphere composition in the reacting furnace for 45 minutes since the start of growth of the SiC epitaxial film in the first comparative example was analyzed using a quadrupole mass spectrometer (Q-Mass).

FIGS. 3A-3D are characteristic graphs showing the gas atmosphere composition in the reacting furnace in each film formation time of the SiC epitaxial film in the first comparative example. FIGS. 3A-3D show the gas atmosphere composition in the reacting furnace after a lapse of 4 minutes, after a lapse of 14 minutes, after a lapse of 24 minutes and after a lapse of 34 minutes since the start of growth (0 minute) of the SiC epitaxial film, respectively. Of the gas atmosphere composition in the reacting furnace during the growth of the SiC epitaxial film shown in FIGS. 3A-3D, attention is paid to Cl atoms contained in the HCl gas. Specifically, attention is paid to $Cl^{35}$ atoms and $Cl^{37}$ atoms which belong to natural isotope compositions and whose masses are about 35 to 37.

Figure 3A:
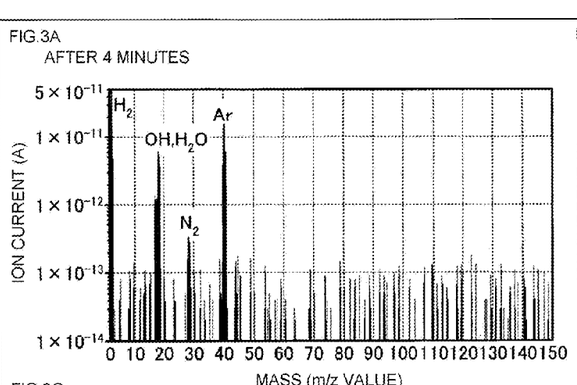
FIGS. 3A-3D are characteristic graphs showing a gas atmosphere composition in a reacting furnace in each film formation time of the SiC epitaxial film in the first comparative example.
Figure 3B:
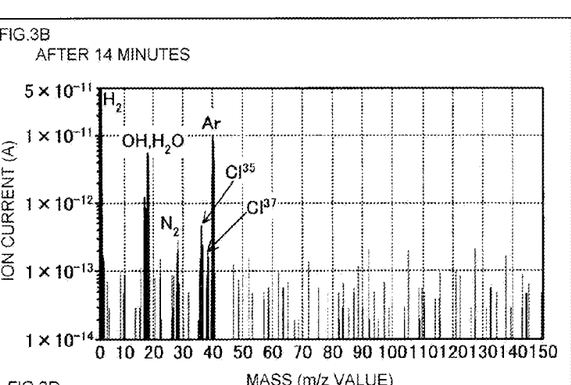

As shown in FIG. 3A, both peaks of $Cl^{35}$ atoms and $Cl^{37}$ atoms were not observed in the gas atmosphere after a lapse of 4 minutes since the start of growth of the SiC epitaxial film. However, as shown in FIG. 3B, both the peaks of $Cl^{35}$ atoms and $Cl^{37}$ atoms were observed in the gas atmosphere after a lapse of 14 minutes since the start of growth of the SiC epitaxial film. Then, as shown in FIG. 3C and FIG. 3D, it was proved that both the peaks of $Cl^{35}$ atoms and $Cl^{37}$ atoms in the gas atmosphere increased as the film formation time of the SiC epitaxial film increased.

Figure 3C:
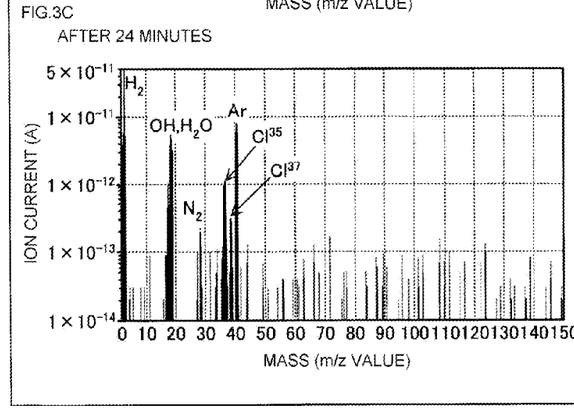
Figure 3D:
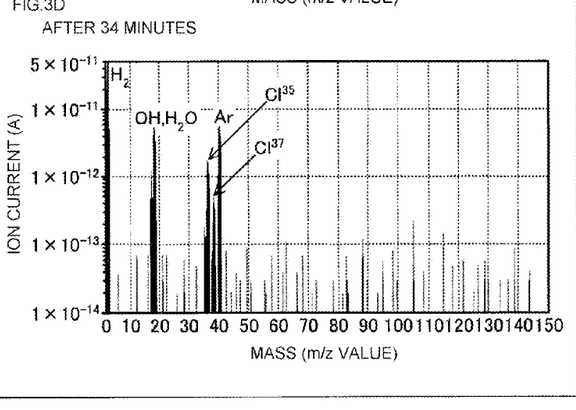

The peaks of $Cl^{35}$ atoms and $Cl^{37}$ atoms appearing in FIGS. 3B-3D indicate the existence of unreacted Cl atoms in the gas atmosphere after a lapse of 14 minutes since the start of growth of the SiC epitaxial film. When the film formation temperature of the SiC epitaxial film in the reacting furnace is about 1,700° C., the SiC epitaxial film which is growing is etched by the unreacted Cl atoms in the gas atmosphere. It is therefore speculated that due to the increase of the unreacted Cl atoms in the gas atmosphere with the passage of the film formation time of the SiC epitaxial film, the increment of the film thickness of the SiC epitaxial film is reduced with the passage of the film formation time of the SiC epitaxial film, as verified in FIG. 2.

About Film Formation Time and Film Thickness of SiC Epitaxial Film 2 in Example

Figure 4:
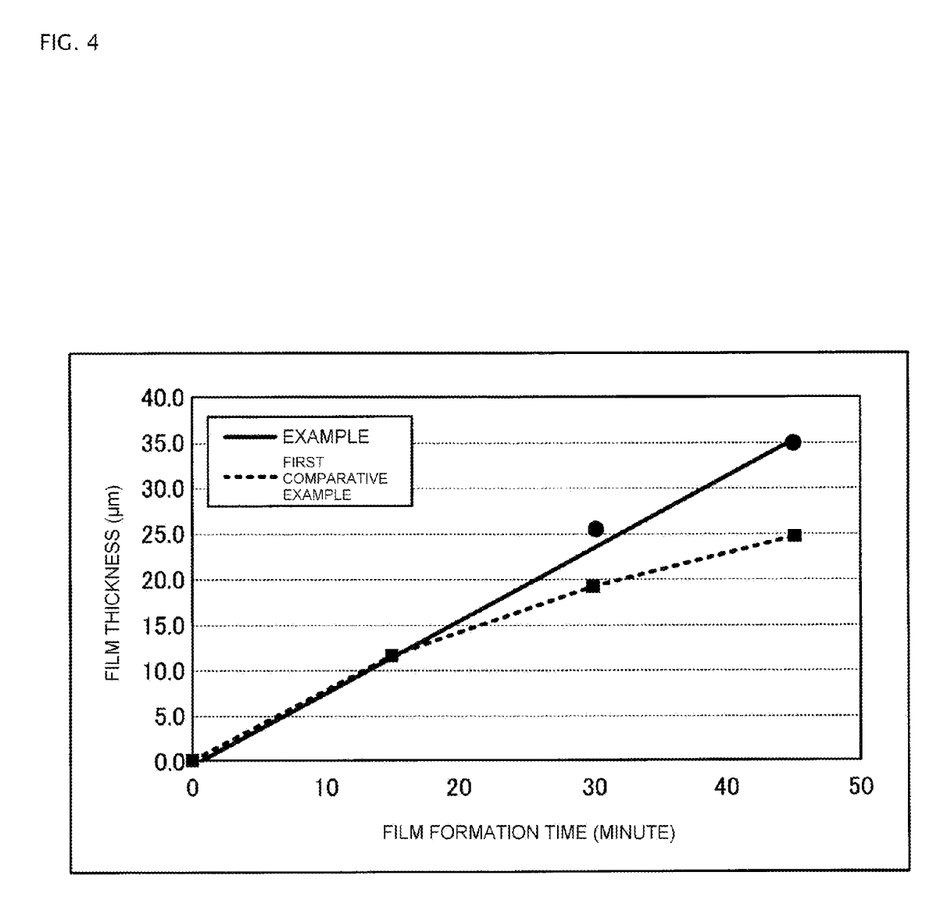
FIG. 4 is a characteristic graph showing the relation between the film formation time and the film thickness of a SiC epitaxial film in an example.

Next, the relation was verified between the film formation time and the film thickness of SiC epitaxial film 2 grown by the method for manufacturing the semiconductor device according to the embodiment. FIG. 4 is a characteristic graph showing the relation between the film formation time and the film thickness of a SiC epitaxial film in an example. The first comparative example designated by the broken line in FIG. 4 is similar to the result of measurement shown in FIG. 2. First, SiC epitaxial film 2 was grown on the surface of 4H—SiC substrate 1 in accordance with the aforementioned method for manufacturing a semiconductor device according to the embodiment (hereinafter referred to as "example").

Film formation conditions in the example were as follows. In the same manner as in the first comparative example, $SiH_4/H_2$ gas, $C_3H_8/H_2$ gas and HCl gas were used as the raw material gas (gas containing Si and gas containing C) and the additive gas (gas containing Cl) to be introduced into the reacting furnace. Then, the introduction amount of the raw material gas was adjusted so that the C/Si ratio in the gas atmosphere in the reacting furnace was kept at 1.0. In addition, the introduction amount of the additive gas was adjusted so that the initial Cl/Si ratio in the gas atmosphere in the reacting furnace became 3.0.

Next, SiC epitaxial film 2 was grown on the surface of 4H—SiC substrate 1 by a CVD method while the introduction amount of the additive gas (HCl gas) was reduced gradually. Specifically, the Cl/Si ratio in the gas atmosphere was reduced at a rate of 0.66%/min since the start of growth of SiC epitaxial film 2 (0 minute). Accordingly, the Cl/Si ratio in the gas atmosphere decreased from 3.0 to 2.4 in 30 minutes since the start of growth of SiC epitaxial film 2, and decreased from 3.0 to 2.1 in 45 minutes since the start of growth of SiC epitaxial film 2.

Then, the film thickness of SiC epitaxial film 2 grown in the aforementioned conditions was measured after a lapse of 15 minutes, after a lapse of 30 minutes and after a lapse of 45 minutes since the start of growth of the SiC epitaxial film 2 (0 minute). The film formation temperature of SiC epitaxial film 2 in the reacting furnace was set at 1,700° C. As shown by the result in FIG. 4, the increment of the film thickness of SiC epitaxial film 2 between the film thickness measuring points (between 0 minute and 15 minutes, between 15 minutes and 30 minutes, and between 30 minutes and 45 minutes) was substantially fixed regardless of the film formation time of SiC epitaxial film 2.

That is, it was proved that a substantially proportional relation was established between the film formation time and the film thickness of SiC epitaxial film 2 when the Cl/Si ratio in the gas atmosphere was reduced gradually during the growth of SiC epitaxial film 2. It was therefore proved that the film thickness of the SiC epitaxial film 2 could be increased without lowering the growth rate of SiC epitaxial film 2 when the Cl/Si ratio in the gas atmosphere was reduced gradually during the growth of SiC epitaxial film 2.

About Cl/Si Ratio in Gas Atmosphere During Growth of SiC Epitaxial Film

Figure 5:
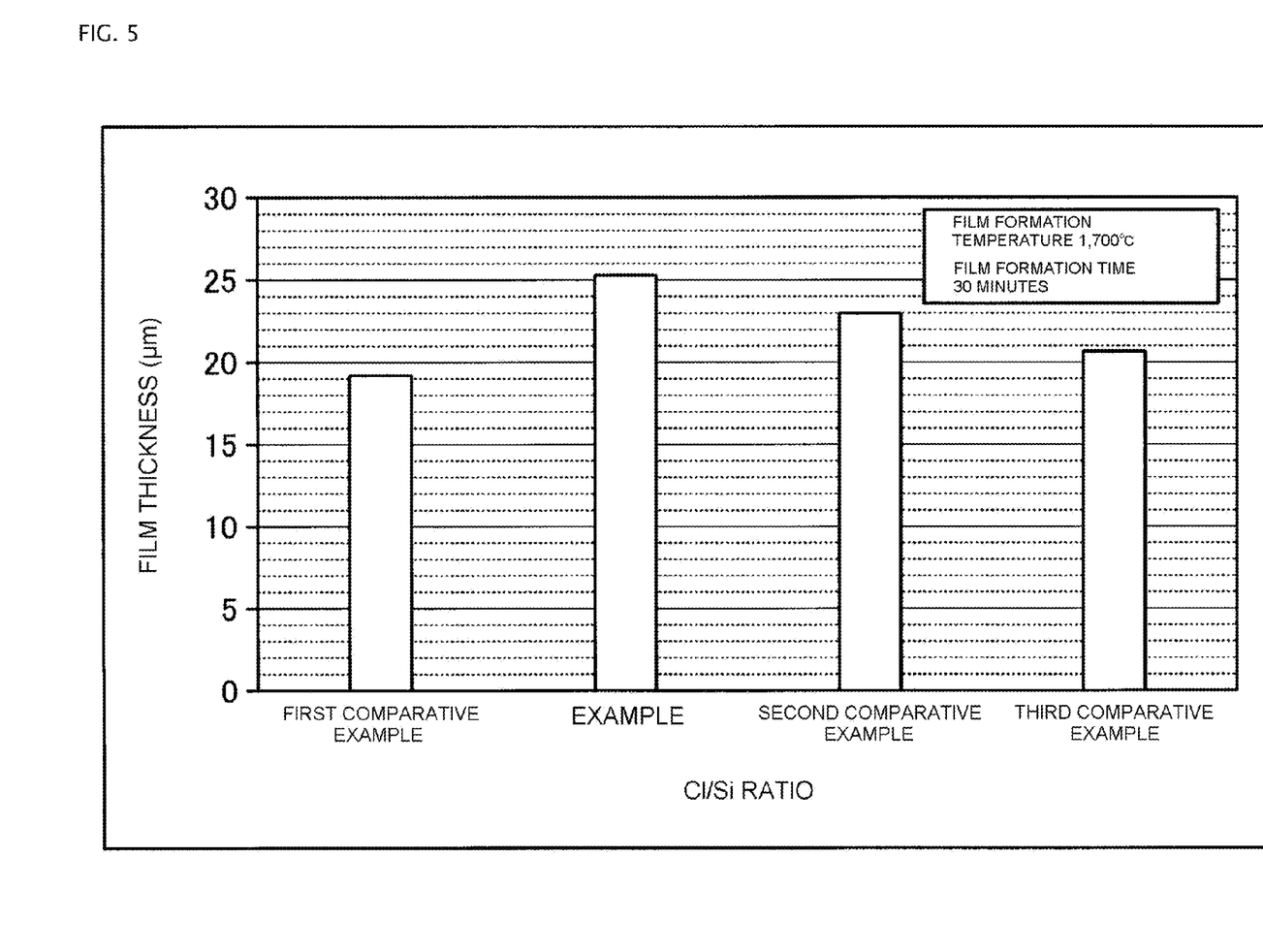
FIG. 5 is a characteristic graph showing the relation between the film formation time of the SiC epitaxial film and the Cl/Si ratio in a gas atmosphere in the example.

Next, the relation was verified between the rate with which the Cl/Si ratio in the gas atmosphere was reduced and the film thickness of the SiC epitaxial film obtained with the Cl/Si ratio reduced at the rate in the gas atmosphere. FIG. 5 is a characteristic graph showing the relation between the film formation time of the SiC epitaxial film and the Cl/Si ratio in the gas atmosphere in the example. The film thickness of the SiC epitaxial film after a lapse of 30 minutes since the start of growth of the SiC epitaxial film was measured while the rate with which the Cl/Si ratio in the gas atmosphere was reduced was changed variously.

The kinds of raw material gas and additive gas introduced into the reacting furnace, the C/Si ratio in the gas atmosphere and the film formation temperature were similar to those in the example. FIG. 5 shows the aforementioned first comparative example, the aforementioned example, and second and third comparative examples in which the Cl/Si ratio in the gas atmosphere was reduced at different rates from that of the aforementioned example. Specifically, in the first comparative example, the initial Cl/Si ratio in the gas atmosphere was set at 3.0, and the Cl/Si ratio during the growth of the SiC epitaxial film was kept at the initial Cl/Si ratio (the Cl/Si ratio=3.0 (fixed)).

In the example, the initial Cl/Si ratio in the gas atmosphere was set at 3.0, and the Cl/Si ratio in the gas atmosphere was reduced at a rate of 0.66%/min during the growth of SiC epitaxial film 2. That is, in the example, the Cl/Si ratio in the gas atmosphere decreased from 3.0 at the start of growth of SiC epitaxial film 2 to 2.4 at the end of growth of SiC epitaxial film 2 (after a lapse of 30 minutes).

In the second comparative example, the initial Cl/Si ratio in the gas atmosphere was set at 3.0, and the Cl/Si ratio in the gas atmosphere was reduced at a rate of 1.33%/min during the growth of the SiC epitaxial film. That is, in the second comparative example, the Cl/Si ratio in the gas atmosphere decreased from 3.0 at the start of growth of the SiC epitaxial film to 1.8 at the end of growth of the SiC epitaxial film.

In the third comparative example, the initial Cl/Si ratio in the gas atmosphere was set at 2.5, and the Cl/Si ratio in the gas atmosphere was reduced at a rate of 1.33%/min during the growth of the SiC epitaxial film. That is, in the third comparative example, the Cl/Si ratio in the gas atmosphere decreased from 2.5 at the start of growth of the SiC epitaxial film to 1.5 at the end of growth of the SiC epitaxial film.

From the result shown in FIG. 5, it was proved that the thickness of the SiC epitaxial film was reduced in the second and third comparative examples. It is therefore found that the growth rate of the SiC epitaxial film is lowered when the rate with which the Cl/Si ratio in the gas atmosphere is reduced is increased (1.33%/min or higher) during the growth of the SiC epitaxial film. It is speculated that that is not because the SiC epitaxial film is etched by the unreacted Cl atoms in the gas atmosphere, but rather because the limitation of Cl supply exceeds the limitation of raw material gas supply so as to make it difficult to grow the SiC epitaxial film.

Therefore, in order to prevent decrease of the growth rate of SiC epitaxial film 2, it is desirable that the upper limit of the rate with which the Cl/Si ratio in the gas atmosphere is reduced during the growth of SiC epitaxial film 2 is set in a range up to about 1.0%/min, in which the limitation of Cl supply cannot exceed the limitation of raw material gas supply. There arises another problem that the contamination in the reacting furnace increases as the Cl/Si ratio in the reacting furnace is lower. It is therefore preferable that the lower limit of the rate with which the Cl/Si ratio in the gas atmosphere is reduced during the growth of SiC epitaxial film 2 is set in a range up to about 0.5%/min, in which the contamination in the reacting furnace can be suppressed.

According to the embodiment, as described above, due to the gas atmosphere in which a suitable amount of gas containing Cl is added to raw material gas, the introduction amount of the raw material gas contributing to the growth of a SiC epitaxial film can be increased. In addition, according to the embodiment, when the number of Cl atoms in the gas containing Cl is reduced gradually with the passage of the film formation time of the SiC epitaxial film, it is possible to reduce the number of unreacted Cl atoms which may increase in the gas atmosphere with the passage of the film formation time of the SiC epitaxial film. It is therefore possible to suppress the situation where the SiC epitaxial film that is growing is etched by the unreacted Cl atoms. In this manner, it is possible to suppress the lowering of the growth rate of the SiC epitaxial film. Thus, it is possible to grow the SiC epitaxial film at a high rate.

In the above description, the invention is not limited to the aforementioned embodiment, but various changes may be made on the invention without departing from the gist of the invention.

As described above, the method for manufacturing a silicon carbide semiconductor device according to the invention is useful for a semiconductor device manufactured using a SiC single-crystal substrate in which a SiC single-crystal film is formed on a SiC substrate when a transistor, a diode or the like is manufactured using SiC as a semiconductor material.

Thus, a SiC substrate and method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A method for manufacturing a silicon carbide semiconductor device, comprising:
   a first step of exposing a silicon carbide semiconductor substrate to a gas atmosphere in which gas containing chlorine is added to gas containing silicon and gas containing carbon, to grow a silicon carbide semiconductor film on the silicon carbide semiconductor substrate; and
   a second step of gradually reducing an introduction amount of the gas containing chlorine relative to the gas containing silicon in the gas atmosphere during the growth of the silicon carbide semiconductor film.

2. The method for manufacturing a silicon carbide semiconductor device according to claim 1, wherein the number of chlorine atoms in the gas containing chlorine relative to the number of silicon atoms in the gas containing silicon in the gas atmosphere is reduced at a rate of 0.5%/minute to 1.0%/minute in the second step.

3. The method for manufacturing a silicon carbide semiconductor device according to claim 2, wherein the second step begins at the start of the first step.

4. The method for manufacturing a silicon carbide semiconductor device to claim 1, wherein the second step begins at the start of the first step.

5. The method for manufacturing a silicon carbide semiconductor device according to claim 4, wherein the number of chlorine atoms in the gas containing chlorine is three times as large as the number of silicon atoms in the gas containing silicon in the composition of the gas atmosphere at the time of start of the first step.

6. The method for manufacturing a silicon carbide semiconductor device according to claim 1, wherein the gas containing chlorine is hydrogen chloride gas or chlorine gas.

7. The method for manufacturing a silicon carbide semiconductor device according to claim 1, wherein the silicon carbide semiconductor film made of a single crystal is grown by a chemical vapor deposition method in the first step.

* * * * *